US011018263B2

(12) United States Patent
Sohn et al.

(10) Patent No.: US 11,018,263 B2
(45) Date of Patent: May 25, 2021

(54) DISPLAY DEVICE AND METHOD OF MANUFACTURING THE SAME

(71) Applicant: Samsung Display Co., Ltd., Yongin-Si (KR)

(72) Inventors: Sangwoo Sohn, Yongin-si (KR); Sangwon Shin, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/584,828

(22) Filed: Sep. 26, 2019

(65) Prior Publication Data

US 2020/0168737 A1 May 28, 2020

(30) Foreign Application Priority Data

Nov. 22, 2018 (KR) .................. 10-2018-0145302

(51) Int. Cl.
*H01L 27/12* (2006.01)
*H01L 29/786* (2006.01)
*H01L 29/66* (2006.01)
*H01L 27/32* (2006.01)

(52) U.S. Cl.
CPC ...... *H01L 29/7869* (2013.01); *H01L 27/1225* (2013.01); *H01L 27/1255* (2013.01); *H01L 27/3248* (2013.01); *H01L 29/66969* (2013.01); *H01L 2227/323* (2013.01)

(58) Field of Classification Search
CPC ............ H01L 27/1225; H01L 27/1255; H01L 27/3248; H01L 29/66969
USPC ........................................................ 257/43
See application file for complete search history.

(56) References Cited

U.S. PATENT DOCUMENTS

| 9,093,541 | B2 | 7/2015 | Kitakado et al. |
| 9,812,582 | B2 | 11/2017 | Yamazaki |
| 2008/0017862 | A1* | 1/2008 | Lee ................... G02F 1/136286 257/59 |
| 2015/0380560 | A1* | 12/2015 | Ishikawa ............. H01L 29/7869 257/43 |

FOREIGN PATENT DOCUMENTS

| KR | 10-1376445 B1 | 3/2014 |
| KR | 10-2018-0042832 A | 4/2018 |

OTHER PUBLICATIONS

US 9,548,396 B2, 01/2017, Yamazaki (withdrawn)

* cited by examiner

*Primary Examiner* — Long K Tran
(74) *Attorney, Agent, or Firm* — Innovation Counsel LLP

(57) ABSTRACT

A display device includes a semiconductor member, a first gate electrode, a pixel electrode, and a common electrode. The semiconductor member includes a source area, a drain area, and a channel area between the source area and the drain area. The first gate electrode includes a first gate barrier layer, a second gate barrier layer, and a gate metal layer. The first gate barrier layer overlaps the channel area. An oxide material of the first gate barrier layer is identical to an oxide material of the semiconductor member. The second gate barrier layer includes a metal oxide alloy and is positioned between the first gate barrier layer and the gate metal layer. The pixel electrode is electrically connected to the drain area. The common electrode overlaps the pixel electrode.

10 Claims, 13 Drawing Sheets

DISPLAY DEVICE AND METHOD OF MANUFACTURING THE SAME

This application claims priority from and the benefit of Korean Patent Application No. 10-2018-0145302 filed on Nov. 22, 2018; the Korean Patent Application is incorporated by reference herein.

BACKGROUND

1. Field

The technical field relates to a display device and a method of manufacturing the display device.

2. Description of the Related Art

In general, a thin film transistor (TFT) may be used as a switching device for independently controlling a pixel in a display device such as a liquid crystal display device (LCD) or an organic light emitting display (OLED) device. A display substrate including a thin film transistor may include a pixel electrode connected to the thin film transistor and may further include signal lines such as a gate line for transmitting a gate signal to the thin film transistor and a data line for transmitting a data voltage to the thin film transistor.

The thin film transistor may include a gate electrode, a source electrode, a drain electrode, and an active layer electrically connected to the source and drain electrodes. The active layer is an important factor in determining the characteristics of a transistor.

The active layer may include silicon (Si). The silicon (Si) may be amorphous silicon or polycrystalline silicon depending on the crystal form. The amorphous silicon has a relatively simple manufacturing process, but has a relatively low charge-mobility. The polycrystalline silicon has a relatively high charge-mobility, but requires a process of crystallizing silicon, which may incur high manufacturing cost and complicated processing.

SUMMARY

Embodiments may be related to a display device with satisfactory reliability.

Embodiments may be related to an efficient method of manufacturing a display device.

According to an embodiment, there is provided a display device including an active pattern disposed on a substrate and including an oxide semiconductor, a transistor including a first gate barrier layer overlapping with a channel area on the active pattern and including a same oxide as the active pattern, a second gate barrier layer including a metal oxide alloy, and a gate electrode having a triple-layer structure in which gate metal layers are sequentially stacked, a pixel electrode electrically connected to the transistor, and a common electrode opposing to the pixel electrode.

In an embodiment, the display device may further include a gate insulating pattern overlapping with the channel area on the active pattern and disposed between the active pattern and the first gate barrier layer.

In an embodiment, each of the active pattern and the first gate barrier layer may include indium-gallium-zinc oxide (IGZO).

In an embodiment, the second gate barrier layer may include an alloy of zinc oxide (ZnOx) and indium oxide (InOx).

In an embodiment, a composition ratio of zinc oxide (ZnOx) and indium oxide (InOx) of the second gate barrier layer may be 9:1.

In an embodiment, the first gate barrier layer may have a thickness of about 200 Å or less.

In an embodiment, the second gate barrier layer may have a thickness of about 200 Å or less.

In an embodiment, the display device may further include a bottom gate electrode disposed between the substrate and the active pattern and overlapping with the channel area.

In an embodiment, the display device may further include an organic light emitting layer disposed between the pixel electrode and the common electrode.

In an embodiment, the display device may further include a storage capacitor including a first storage electrode and a second storage electrode, and a gate line connected to the gate electrode, wherein the first storage electrode and the gate line may have a triple-layer structure in which the first gate barrier layer, the second gate barrier layer including the metal oxide alloy, and the gate metal layer are sequentially stacked.

According to an embodiment, there is provided a method of manufacturing a display device including forming an oxide semiconductor layer on a substrate under a low-oxygen partial pressure condition, patterning the oxide semiconductor layer to form an active pattern of the transistor, forming a first gate barrier layer including a same oxide as the active pattern on the active pattern under a high-oxygen partial pressure condition, forming a second gate barrier layer including a metal oxide alloy on the first gate barrier layer, forming a gate metal layer on the second gate barrier layer, patterning the first gate barrier layer, the second gate barrier layer and the gate metal layer simultaneously to form a gate electrode of a triple-layer structure on a channel area of the active pattern, forming a pixel electrode connected to the transistor, and forming a common electrode opposing to the pixel electrode.

In an embodiment, the low-oxygen partial pressure condition may be less than about 40%.

In an embodiment, the high-oxygen partial pressure condition may be greater than about 60%.

In an embodiment, the forming the gate electrode may include forming a gate insulating pattern disposed between the channel area on the active pattern and the first gate barrier layer.

In an embodiment, each of the active pattern and the first gate barrier layer may include indium-gallium-zinc oxide (IGZO).

In an embodiment, the second gate barrier layer may include an alloy of zinc oxide (ZnOx) and indium oxide (InOx).

In an embodiment, a composition ratio of zinc oxide (ZnOx) and indium oxide (InOx) of the second gate barrier layer may be 9:1.

In an embodiment, the first gate barrier layer may have a thickness of about 200 Å or less.

In an embodiment, the second gate barrier layer may have a thickness of about 200 Å or less.

In an embodiment, the forming the gate electrode may include forming a storage capacitor including a first storage electrode and a second storage electrode, and a gate line connected to the gate electrode, wherein the first storage electrode and the gate line may have a triple-layer structure in which the first gate barrier layer, the second gate barrier layer including the metal oxide alloy, and the gate metal layer are sequentially stacked.

An embodiment may be related to a display device. The display device may include a semiconductor member, a first gate electrode, a pixel electrode, and a common electrode. The semiconductor member may include a source area, a drain area, and a channel area between the source area and the drain area in a first direction. The first gate electrode may include a first gate barrier layer, a second gate barrier layer, and a gate metal layer. The first gate barrier layer may overlap the channel area and may be insulated from the semiconductor member. An oxide material of the first gate barrier layer may be identical to an oxide material of the semiconductor member. The second gate barrier layer may include a metal oxide alloy and may be positioned between the first gate barrier layer and the gate metal layer in a second direction different from the first direction. The pixel electrode may be electrically connected to the drain area. The common electrode may overlap the pixel electrode.

The first gate barrier layer may be positioned between the semiconductor member and the second gate barrier layer.

The display device may include a gate insulating member overlapping the channel area and disposed between the semiconductor member and the first gate barrier layer.

Each of the semiconductor member and the first gate barrier layer may include indium-gallium-zinc oxide (IGZO).

The second gate barrier layer may include an alloy of zinc oxide (ZnOx) and indium oxide (InOx).

A composition ratio of the zinc oxide (ZnOx) and the indium oxide (InOx) of the second gate barrier layer may be 9:1.

The first gate barrier layer may have a thickness of about 200 angstroms or less.

The second gate barrier layer may have a thickness of about 200 angstroms or less.

The display device may include the following elements: a substrate; and a second gate electrode disposed between the substrate and the semiconductor member and overlapping the channel area.

The display device may include an organic light emitting layer disposed between the pixel electrode and the common electrode.

The display device may include the following elements: a storage capacitor comprising a first storage electrode and a second storage electrode; and a gate line electrically connected to the first gate electrode. Each of a triple-layer structure of the first storage electrode and a triple-layer structure of the gate line may be identical to a triple-layer structure of the first gate electrode.

An embodiment may be related to a method of manufacturing a display device. The method may include the following steps: forming an oxide semiconductor layer under a first condition; partially removing the oxide semiconductor layer to form an semiconductor member; subsequently, forming a first gate barrier material layer under a second condition, wherein the first gate barrier material layer may overlap the semiconductor member, wherein an oxide material of the first gate barrier material layer may be identical to an oxide material of the semiconductor member, and wherein an oxygen partial pressure of the second condition may be higher than an oxygen partial pressure of the first condition; subsequently, forming a second gate barrier material layer on the first gate barrier material layer, wherein the second gate barrier material layer may include a metal oxide alloy; subsequently, forming a gate metal material layer on the second gate barrier material layer; partially removing the first gate barrier material layer, the second gate barrier material layer, and the gate metal material layer to form a first gate electrode, wherein the first gate electrode may overlap a channel area of the semiconductor member and may include a first gate barrier layer, a second gate barrier layer, and a gate metal layer; forming a pixel electrode electrically connected to a drain area of the semiconductor member; and forming a common electrode overlapping the pixel electrode.

The oxygen partial pressure of the first condition may be less than about 40%.

The oxygen partial pressure of the second condition may be greater than about 60%.

The method may include forming a gate insulating member between the channel area of the semiconductor member and the first gate barrier layer.

Each of the semiconductor member and the first gate barrier layer may include indium-gallium-zinc oxide (IGZO).

The second gate barrier layer may include an alloy of zinc oxide (ZnOx) and indium oxide (InOx).

A composition ratio of the zinc oxide (ZnOx) and the indium oxide (InOx) of the second gate barrier layer may be 9:1.

The first gate barrier layer may have a thickness of about 200 angstroms or less.

The second gate barrier layer may have a thickness of about 200 angstroms or less.

The method may include the following steps: forming a storage capacitor comprising a first storage electrode and a second storage electrode; and forming a gate line electrically connected to the first gate electrode. Each of a triple-layer structure of the first storage electrode and a triple-layer structure of the gate line may be identical to a triple-layer structure of the first gate electrode.

According to embodiments, a gate electrode may have a triple-layer structure in which a first gate barrier layer, a second gate barrier layer, and a gate metal layer are sequentially stacked.

According to embodiment, an active pattern (or semiconductor member) including an oxide semiconductor may be formed in a low-oxygen partial pressure condition to improve the reliability of the associated transistor. In embodiments, a gate electrode includes a first gate barrier layer formed in a high-oxygen partial pressure condition to compensate for oxygen defects in the active pattern formed in the low-oxygen partial pressure condition. In embodiments, the gate electrode includes a second gate barrier layer to prevent oxidation of a gate metal layer, thereby preventing oxidation of the gate electrode and the associated gate line. In embodiments, the first gate barrier layer, the second gate barrier layer, and the gate metal layer are substantially simultaneously formed in the same etching step. Advantageously, the manufacturing process may be simple and efficient.

DETAILED DESCRIPTION

Example embodiments are described with reference to the accompanying drawings.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

The term "pattern" may mean "member." The term "patterned" may mean "partially removed." The term "patterning" may mean "partially removing." The term "active pattern" may mean "semiconductor member." The term "insulate" may mean "electrically insulate" or "electrically isolate." The term "connect" may mean "electrically connect." The term "conductive" may mean "electrically conductive." The description that an element may include materials may mean that the element may include at least one of the materials. The term "partial pressure" may mean "volume concentration."

Figure 1:
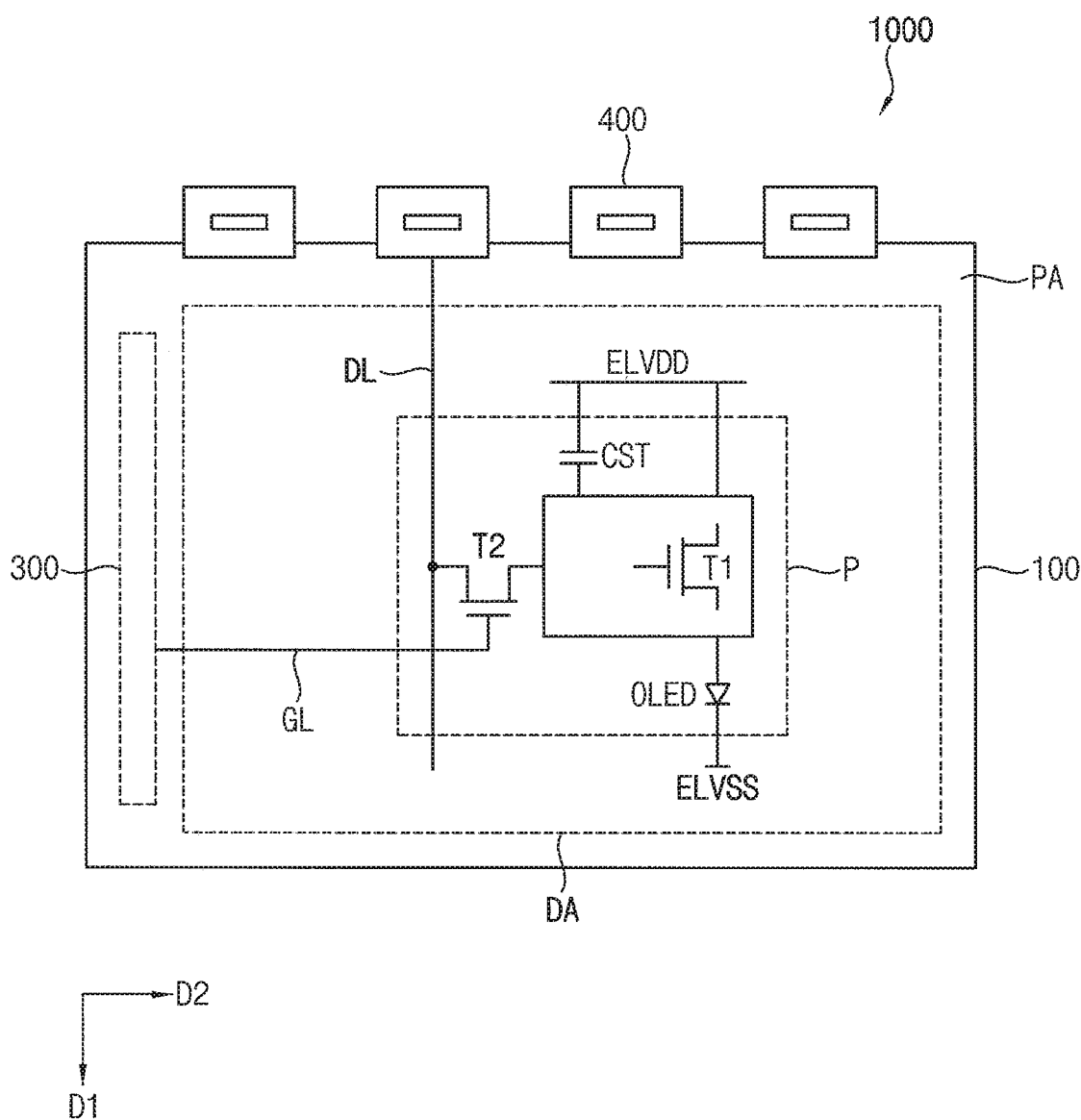
FIG. 1 is a schematic plan view illustrating an organic light emitting display device according to one embodiment.

FIG. 1 is a schematic plan view illustrating a display device according to one embodiment.

Referring to FIG. 1, the display device 1000 may include a display panel 100 and a source driver 400.

The display panel 100 may include a display area DA and a peripheral area PA surrounding the display area DA.

The display panel 100 may include a plurality of data lines DL, a plurality of gate lines GL, and a plurality of pixels P in the display area DA.

The data lines DL may extend in a first direction D1 and may be arranged in a second direction D2 different from the first direction D1.

The gate lines GL may extend in the second direction D2 and may be arranged in the first direction D1.

The pixels P may include a pixel column including pixels arranged in the first direction D1 and may include a pixel row including pixels arranged in the second direction D2.

Each pixel includes a pixel circuit, and the pixel circuit may include at least one transistor T1 and/or T2, a storage capacitor CST, and a display element for displaying an image using light. The display element may be/include a liquid crystal member and/or an organic light emitting diode OLED.

According to one embodiment, the display element may be an organic light emitting diode OLED.

The first transistor T1 may provide a driving current to the organic light emitting diode OLED to enable the organic light emitting diode OLED to emit light.

The second transistor T2 may be connected to the gate line GL and the data line DL and may provide a data voltage (transmitted by the data line DL) to the first transistor T1.

In one embodiment, the transistors T1 and T2 may include active patterns including oxide semiconductors.

In one embodiment, each of the gate electrode of the transistor T1, the gate electrode of the transistor T2, a first storage electrode of the storage capacitor CST, and the gate line GL may include a triple-layer structure in which a first gate barrier layer, a second gate barrier layer, and a gate metal layer are sequentially stacked.

In one embodiment, the triple-layer structure may include an IGZO layer, a ZIO alloy layer, and a Cu that are sequentially stacked.

The gate driver 300 for providing a gate signal to the gate line GL may be disposed in a peripheral area PA of the display panel 100. The gate driver 300 may include a plurality of circuit transistors formed directly in the peripheral area PA through a same manufacturing process as the transistor T1 and/or the transistor T2.

In one embodiment, each of the circuit transistors may include an active pattern including oxide semiconductor.

In one embodiment, each of the gate electrodes of the circuit transistors may include a triple-layer structure in which a first gate barrier layer, a second gate barrier layer, and a gate metal layer are sequentially stacked.

The source driver 400 may be connected to a plurality of pads formed in the peripheral area PA of the display panel 100.

The source driver 400 may include a data driving circuit for generating a data voltage provided to the data line DL.

Figure 2:
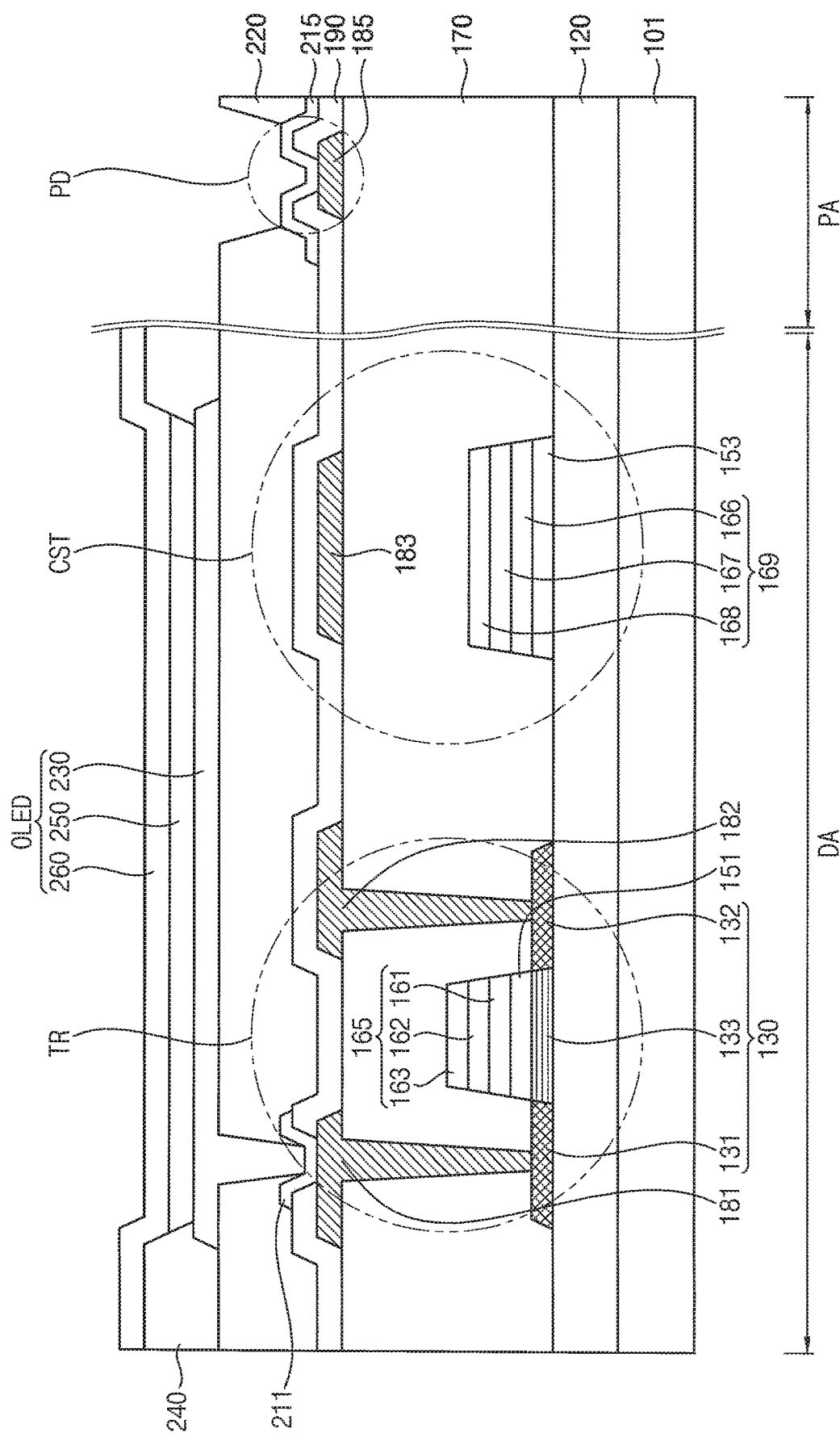
FIG. 2 is a cross-sectional view of a display device according to one embodiment.

FIG. 2 is a cross-sectional view of a display device according to one embodiment.

Referring to FIGS. 1 and 2, the display panel 100 may include a transistor TR (which may represent the transistor T1 and/or the transistor T2), a storage capacitor CST, an organic light emitting diode OLED disposed in a display area DA on the substrate 101, and a pad PD disposed in a peripheral area PA on the substrate 101.

A buffer layer 120 may be disposed on the substrate 101. The buffer layer 120 may prevent impurities such as oxygen, moisture, and the like from penetrating into components that are disposed on the substrate 101.

The buffer layer 120 may provide a flat surface on the substrate 101. The buffer layer 120 may include silicon nitride (SiNx), silicon oxide (SiOx), and the like.

In one embodiment, the transistor TR may be an n-channel transistor. In an embodiment, the transistor TR may be a p-channel transistor. The transistor TR may have a top gate structure and may include an active pattern 130, a gate electrode 165, a source electrode 181, and a drain electrode 182.

The active pattern 130 may be disposed on the buffer layer 120. The active pattern 130 may include a source area 131, a drain area 132, and a channel area 133 located between the source area 131 and the drain area 132.

The active pattern 130 may include an oxide semiconductor.

The active pattern 130 may include a metal oxide, or a combination of metal and metal oxide.

For example, the metal oxide may be selected from the group consisting of tin oxide (SnO2), zinc-tin oxide (ZTO), indium-zinc-tin oxide (IZTO), indium-gallium-zinc-tin oxide (IGZTO), indium oxide (InO), gallium oxide (GaO), indium-zinc oxide (IZO), indium-gallium oxide (IGO), indium-gallium-zinc oxide (IGZO), and the like.

In one embodiment, the active pattern 130 may include indium-gallium-zinc oxide (IGZO).

In one embodiment, the active pattern 130 may include metal oxide formed under a low-oxygen partial pressure condition to improve mobility.

In one embodiment, the active pattern 130 may include metal oxide formed under a condition of an oxygen partial pressure of about 40% or less.

A first gate insulating pattern 151 and a second gate insulating pattern 153 may be disposed on the active pattern 130 and/or the buffer layer 120. The first and second gate insulating patterns 151 may include insulating materials such as silicon oxide (SiOx), silicon nitride (SiNx), and the like.

The first gate insulating pattern 151 may overlap the channel area 133.

The second gate insulating pattern 153 may overlap the first storage electrode 169 of the storage capacitor CST. Although not shown in figures, the second gate insulating pattern 153 may overlap a gate line GL.

A gate electrode 165 may be disposed on the first gate insulating pattern 151. The gate electrode 165 may overlap the channel area 133.

The gate electrode 165 may have a triple-layer structure in which a first gate barrier layer 161, a second gate barrier layer 162, and a gate metal layer 163 are sequentially stacked on the first gate insulating pattern 151.

The first gate barrier layer 161 may include a same metal oxide as the active pattern 130.

In one embodiment, the first gate barrier layer 161 may include indium-gallium-zinc oxide (IGZO).

In one embodiment, the first gate barrier layer 161 may be formed in a high-oxygen partial pressure condition with a partial pressure of oxygen higher than the partial pressure of oxygen of the low-oxygen partial pressure condition used for forming the active pattern 130.

The first gate barrier layer 161 may be formed in the high-oxygen partial pressure condition to fill oxygen defects of the active pattern 130 generated in the low-oxygen partial pressure condition.

In one embodiment, the first gate barrier layer 161 may be formed under an oxygen partial pressure of about 60% or more.

The second gate barrier layer 162 may include a metal oxide alloy. The second gate barrier layer 162 may prevent oxidation of the gate metal layer 163.

In one embodiment, the second gate barrier layer 162 may include an alloy (ZIO alloy) of zinc oxide (ZnOx) and indium oxide (InOx).

In one embodiment, the composition ratio of the zinc oxide (ZnOx) and the indium oxide (InOx) may be 9:1. The composition ratio may be set considering an etch profile in an etching process which substantially simultaneously etches material layers for forming the triple-layer structure of the gate electrode 165.

The gate metal layer 163 may include at least one of copper (Cu), a copper alloy, aluminum (Al), an aluminum alloy, molybdenum Mo, and a molybdenum alloy.

In one embodiment, the gate metal layer 163 may include copper (Cu).

The first storage electrode 169 of the storage capacitor CST may be disposed on the second gate insulating pattern 153.

The first storage electrode 169 of the storage capacitor CST may have a triple-layer structure in which a first gate barrier layer 166, a second gate barrier layer 167, and a gate metal layer 168 are sequentially stacked on the second gate insulating pattern 153.

Although not shown in figures, a gate line GL may be disposed on the second gate insulating pattern 153. The gate line GL may have a triple-layer structure in which a first gate barrier layer, a second gate barrier layer, and a gate metal layer are sequentially stacked on the second gate insulating pattern 153.

The first gate barrier layer 166 may include a same metal oxide as the active pattern 130.

In one embodiment, the first gate barrier layer 166 may include indium-gallium-zinc oxide (IGZO).

In one embodiment, the first gate barrier layer 166 may be formed in a high-oxygen partial pressure that is higher than the low-oxygen partial pressure used for forming the active pattern 130.

In one embodiment, the first gate barrier layer 166 may be formed at an oxygen partial pressure of about 60% or more.

The second gate barrier layer 167 may include the metal oxide alloy. The second gate barrier layer 167 may prevent oxidation of the gate metal layer 168.

In one embodiment, the second gate barrier layer 167 may include a ZIO alloy of zinc oxide (ZnOx) and indium oxide (InOx).

In one embodiment, the composition ratio of the zinc oxide (ZnOx) and the indium oxide (InOx) may be 9:1. The composition ratio may be set considering the etching profile in the etching process that substantially simultaneously etches material layers for forming the triple-layer structure of the first storage electrode 169 and the gate line GL.

The gate metal layer 168 may include at least one of copper (Cu), a copper alloy, aluminum (Al), an aluminum alloy, molybdenum (Mo), and a molybdenum alloy.

In one embodiment, the gate metal layer 168 may include copper (Cu).

An interlayer insulating layer 170 may be formed on the gate electrode 165 and the first storage electrode 169. The interlayer insulating layer 170 may include an insulating material such as silicon oxide (SiOx), silicon nitride (SiNx), or the like.

A source electrode 181, a drain electrode 182, and a second storage electrode 183 of the storage capacitor CST may be disposed in the display area DA on the interlayer insulating layer 170. A line end portion 185 may be disposed in the peripheral area PA on the interlayer insulating layer 170.

Each of the source electrode 181, the drain electrode 182, the second storage electrode 183, and the line end portion 185 may include at least one of copper (Cu), a copper alloy, aluminum (Al), an aluminum alloy, molybdenum (Mo), and molybdenum alloy.

The source electrode 181 and the drain electrode 182 may be electrically connected to the source area 131 and the drain area 132 of the active pattern 130 through contact holes formed in the interlayer insulating layer 170, respectively.

The second storage electrode 183 may overlap the first storage electrode 169.

The line end portion 185 may correspond to an end portion of a signal line disposed in the display area DA. The signal line may be/include one of a data line, a voltage line, and the like.

A passivation layer 190 may be disposed on the source electrode 181, the drain electrode 182, the second storage electrode 183, and the line end portion 185. The passivation layer 190 may include an insulating material such as silicon oxide (SiOx), silicon nitride (SiNx), or the like.

A connection electrode 211 may be disposed in the display area DA on the passivation layer 190. A pad electrode 215 may be disposed in the peripheral area PA on the passivation layer 190. The connection electrode 211 and the pad electrode 215 may include transparent conductive materials such as indium tin oxide (ITO), indium zinc oxide (IZO), and zinc oxide (ZnO).

The connection electrode 211 may be electrically connected to an electrode of the transistor TR, for example, the drain electrode 182 through a contact hole formed in the passivation layer 190. The pad electrode 215 may be electrically connected to the line end portion 185 through a contact hole formed in the passivation layer 190.

A planarization layer 220 may be thickly formed on the connection electrode 211 and the pad electrode 215 to planarize a top-surface of the substrate 101. The planarization layer 220 may include an organic material such as an acrylic resin, an epoxy resin, a polyimide resin, and a polyester resin.

The planarization layer 220 includes a via-hole exposing the connection electrodes 211 in the display area DA, and may be partially removed in the peripheral area PA. As shown in FIG. 2, the planarization layer 220 may be partially removed to expose the pad electrode 215.

The pixel electrode 230 may be disposed in a pixel area on the planarization layer 220. The pixel electrode 230 may be a reflective electrode. The reflective electrode may include a metal such as Al, Ag, W, Cu, Ni, Cr, Mo, Ti, Pt, Ta, Nd or Sc or an alloy of some of the metals. The pixel electrode 230 may include a transparent conductive material having a high work function. For example, the pixel electrode 230 may include indium tin oxide (ITO), indium zinc oxide (IZO), zinc oxide, or indium oxide.

In one embodiment, the pixel electrode 230 may have a multi-layer structure including a metal and a transparent conductive material.

The pixel electrode 230 may be electrically connected to the connection electrode 211 through the via-hole. The pixel electrode 230 may be electrically connected to the transistor TR.

A pixel defining layer 240 may be disposed in the display area DA on the planarization layer 220 and may include an opening exposing the pixel electrode 230. The pixel defining layer 220 may include a transparent organic material such as polyimide resin or acrylic resin.

An organic light emitting layer 250 may be disposed in the opening of the pixel defining layer 240. The organic light emitting layer 250 may include a host material that is excited by holes and electrons, and a dopant material that increases light emission efficiency through absorption and emission of energy.

A common electrode 260 may be disposed opposite the pixel electrode 230 and may span a plurality of pixel areas on the substrate 101. The common electrode 260 may include a metal having a low work function such as Al, Ag, W, Cu, Ni, Cr, Mo, Ti, Pt, Ta, Nd or Sc or an alloy of the metal.

In one embodiment, a hole transport layer (HTL) may be disposed between the pixel electrode 230 and the organic light emitting layer 250. In addition, an electron transport layer (ETL) may be disposed between the organic light emitting layer 250 and the common electrode 260. The hole transporting layer and/or the electron transporting layer may span the plurality of pixel areas.

The organic light emitting diode OLED may include the pixel electrode 230, the organic light emitting layer 250, and a portion of the common electrode 260. The pixel electrode 230 and the common electrode 260 may be provided as a cathode anode and an anode cathode of the organic light emitting diode OLED, respectively.

Figure 3A:
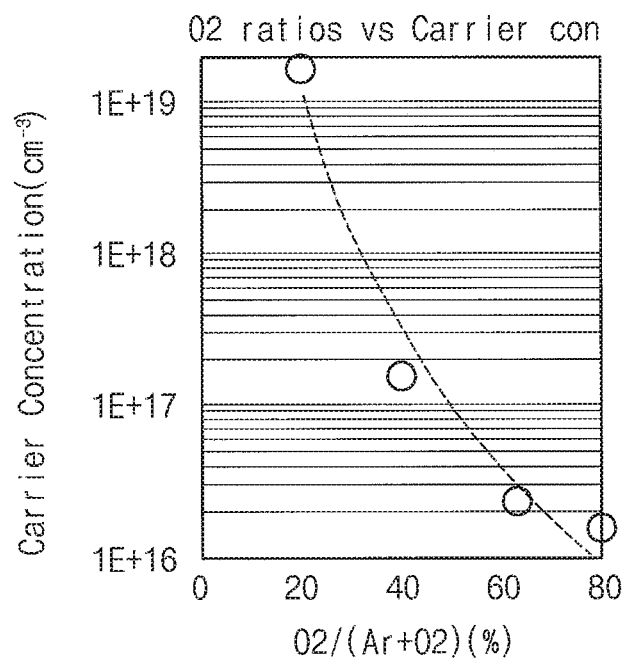
FIG. 3A, FIG. 3B, and FIG. 3C are graphs illustrating characteristics of a transistor according to oxygen partial pressure values (or oxygen concentration values) in the formation of an oxide semiconductor layer according to one or more embodiments.
Figure 3B:
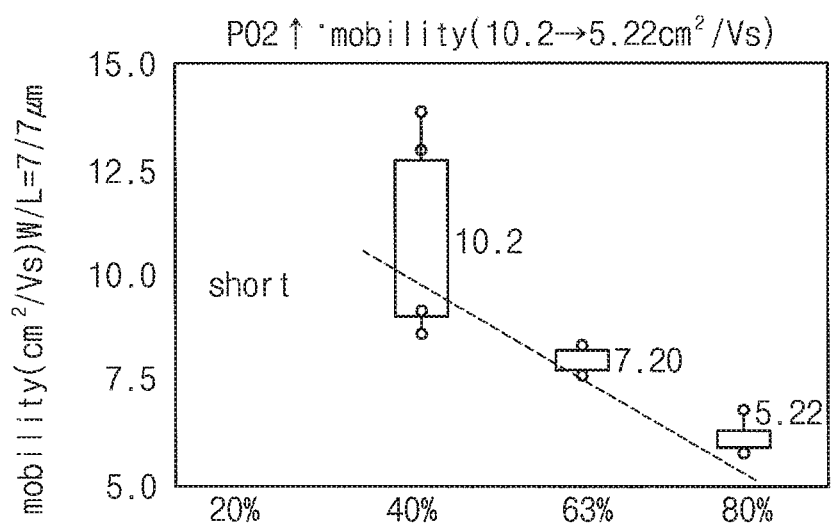
Figure 3C:
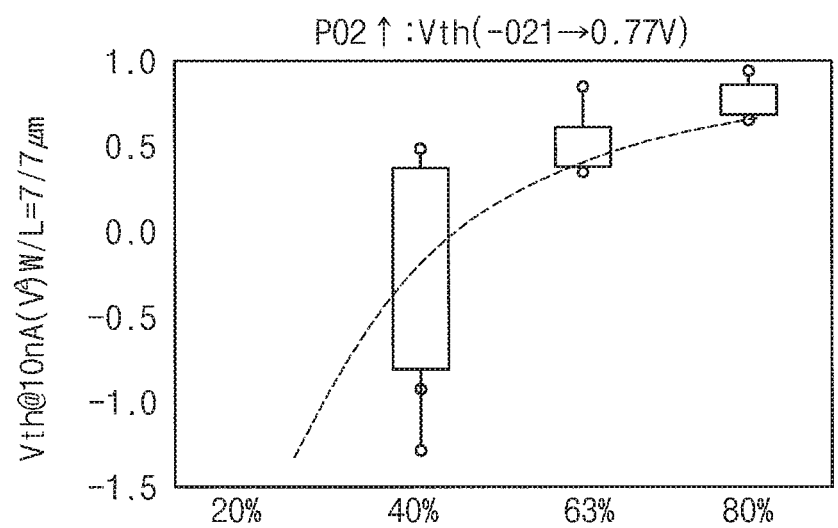

FIGS. 3A to 3C are graphs illustrating characteristics of a transistor according to oxygen partial pressure values (or oxygen concentration values) in the formation of an oxide semiconductor layer.

FIG. 3A is a graph showing carrier concentration values according to oxygen partial pressure values (or oxygen concentration values) in a process of forming an oxide semiconductor layer. FIG. 3B is a graph showing mobility values according to an oxygen partial pressure (or oxygen concentration) in a process of forming an oxide semiconductor layer. FIG. 3C is a graph showing threshold voltage values according to oxygen partial pressure values (or oxygen concentration values) in a process of forming an oxide semiconductor layer.

Referring to FIGS. 3A, 3B and 3C, in the process of forming the oxide semiconductor layer as the active layer of the transistor, the carrier concentration of the oxide semiconductor layer may increase as the oxygen partial pressure (or oxygen concentration) decreases.

Table shows semiconductor carrier concentration values according to the oxygen partial pressure values (%) calculated as energy band offset.

TABLE

| | Oxygen partial pressure condition | | | |
| --- | --- | --- | --- | --- |
| | 20% | 40% | 63% | 80% |
| Carrier concentration | $1.63 \times 10^{19}/cm^3$ | $1.57 \times 10^{17}/cm^3$ | $2.27 \times 10^{16}/cm^3$ | $1.54 \times 10^{16}/cm^3$ |

The carrier concentration increases sharply when the oxygen partial pressure (%) is less than about 40%, which is a low-oxygen partial pressure condition. As the carrier concentration increases, the conductivity of the semiconductor may increase.

When the conductivity increases, the mobility of the transistor may increase, and the threshold voltage (Vth) may become negative. Therefore, reliability of the transistor may be improved.

Referring to FIGS. 3B and 3C, when the oxygen partial pressure (%) decreases, the reliability of the transistor represented by the mobility and the threshold voltage (Vth) may improve. However, if the oxygen partial pressure (%) is about 20% or less, unwanted short-circuiting may occur between the source and the drain.

Therefore, in order to apply the low-oxygen partial pressure condition in the process of forming the oxide semiconductor layer, additional processes and additional layers for ensuring stability of the transistor may be required.

In one embodiment, the active layer including the oxide semiconductor is formed with a low-oxygen partial pressure of about 40% or less to improve the reliability of the transistor. In the process of forming a gate electrode, a first gate barrier layer may be formed in a high-oxygen partial pressure of about 60% or more to compensate for oxygen defects in the active layer formed in the low-oxygen partial pressure condition. The first gate barrier layer may include the oxide semiconductor included in the active layer of the transistor.

FIGS. 4 to 10 are cross-sectional views illustrating structures formed in a method of manufacturing a display device according to one embodiment.

Figure 4:
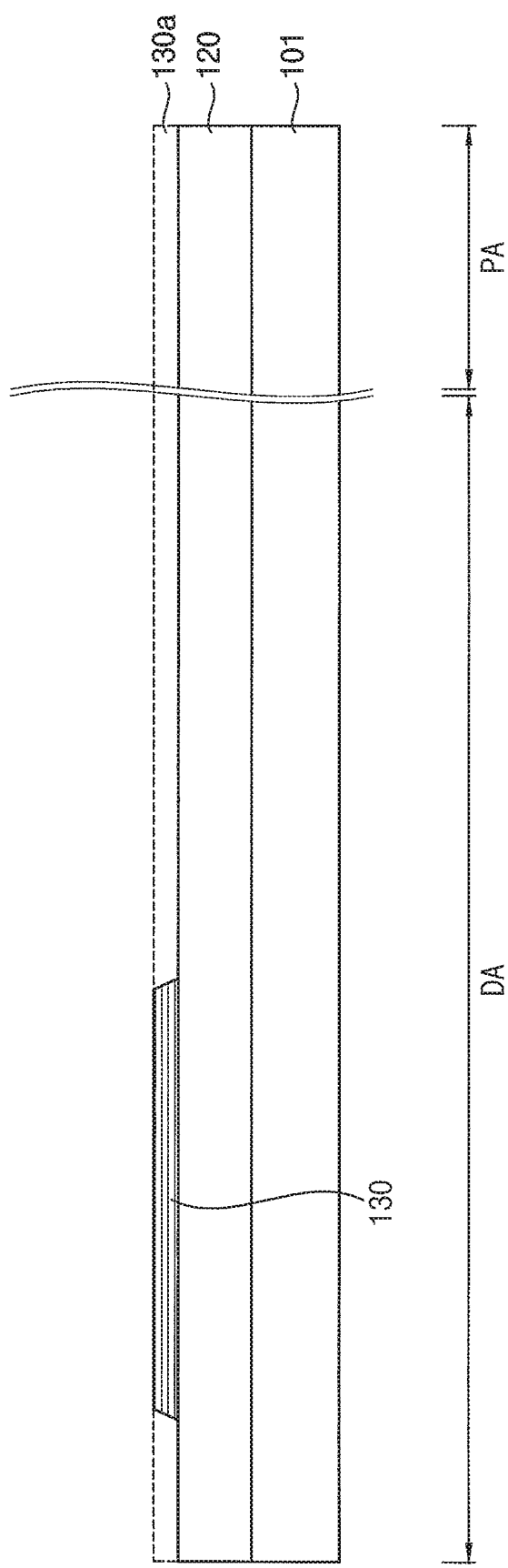
FIG. 4, FIG. 5, FIG. 6, FIG. 7, FIG. 8, FIG. 9, and FIG. 10 are cross-sectional views illustrating structures formed in a method of manufacturing a display device according to one embodiment.

Referring to FIG. 4, a buffer layer 120 may be formed on the substrate 101. For example, the buffer layer 120 may be formed of silicon oxide (SiOx), silicon nitride (SiNx), or the like on the substrate 101 by a chemical vapor deposition (CVD) process, a sputtering process, or the like.

An oxide semiconductor layer 130a may be formed on the buffer layer 120.

For example, the oxide semiconductor layer 130a may be formed using chemical vapor deposition (CVD). The oxide semiconductor layer 130a may include zinc oxide (ZnO), indium oxide (InO), gallium oxide (GaO), indium-zinc oxide (IZO), indium-gallium oxide (IGO), indium-gallium-zinc oxide (IGZO), and the like.

The oxide semiconductor layer 130a is formed in an oxygen partial pressure of about 40% or less, so that reliability of the associated transistor represented by mobility and threshold voltage may be optimized. However, due to the low-oxygen partial pressure condition, a significant amount of oxygen defects may be generated.

The oxide semiconductor layer 130a may be patterned (i.e., partially removed) through a photolithography process to form an active pattern 130 on the buffer layer 120.

Figure 5:
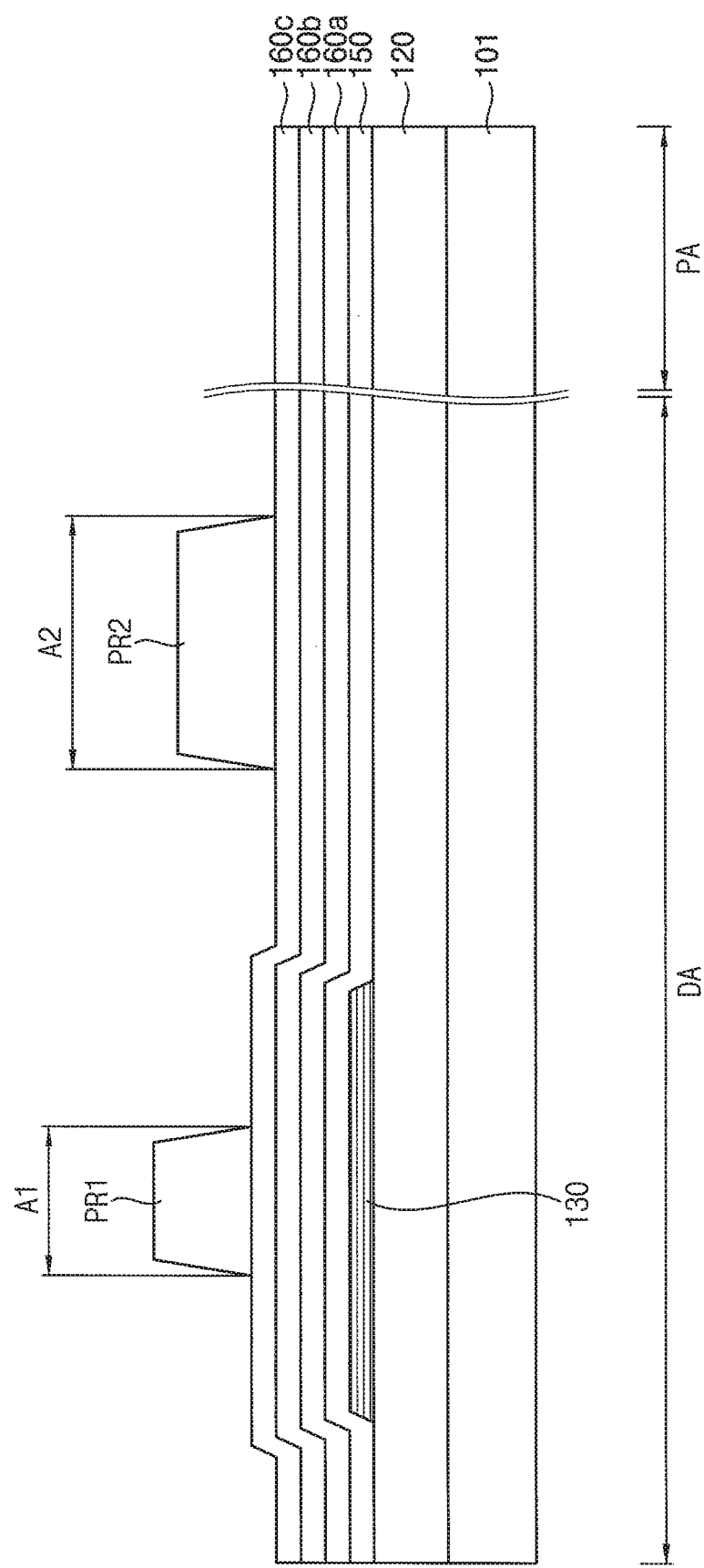

Referring to FIG. 5, the gate insulating layer 150 is formed on the active pattern 130.

The gate insulating layer 150 may be formed using chemical vapor deposition (CVD).

The first gate barrier (material) layer 160a may be formed on the gate insulating layer 150.

The first gate barrier layer 160a may include the same metal oxide as the active pattern 130.

In one embodiment, the first gate barrier layer 160a may include indium-gallium-zinc oxide IGZO.

In one embodiment, the first gate barrier layer 160a may have a thickness of less than about 200 Å (200 angstroms) considering an undercut generated in a subsequent etching process.

During the chemical vapor deposition CVD for the formation of the first gate barrier layer 160a, the oxygen partial pressure condition may be set to a high-oxygen partial pressure of about 60% or more.

When the first gate barrier layer 160a is deposited in the high-oxygen partial pressure condition, oxygen may be provided to the active pattern 130 previously formed in the low-oxygen partial pressure condition. Thus, the high-oxygen process may compensate for oxygen defects of the active pattern 130.

The second gate barrier (material) layer 160b may be formed on the first gate barrier layer 160a.

In one embodiment, the second gate barrier layer 160b may have a thickness of less than about 200 Å (200 angstroms) considering an undercut generated in the subsequent etching process.

The second gate barrier layer 160b may include a metal oxide alloy. The second gate barrier layer 160b may prevent oxidation of an overlying metal layer.

In one embodiment, the second gate barrier layer 160b may include an alloy (ZIO alloy) of zinc oxide (ZnOx) and indium oxide (InOx).

In one embodiment, the composition ratio of the zinc oxide (ZnOx) and the indium oxide (InOx) may be 9:1. The composition ratio may be set considering the etch profiles of the first gate barrier layer 160a and the gate metal layer 160c during the etching process.

The gate metal (material) layer 160c is formed on the second gate barrier layer 160b.

The gate metal layer 160c may include at least one of copper (Cu), a copper alloy, aluminum (Al), an aluminum alloy, molybdenum (Mo), and a molybdenum alloy.

In one embodiment, the gate metal layer 160c may include copper (Cu).

A photoresist layer may be formed on the gate metal layer 160c. The photoresist layer may be formed of a photosensitive organic material.

The photoresist layer is patterned to form a first photoresist pattern PR1 in a first area A1 where the gate electrode 165 is to be formed, and a second photoresist pattern PR2 in a second area A2 in which the storage capacitor CST is to be formed. Although not shown in figures, the second photoresist pattern PR2 may be formed in an area where a gate line GL is to be formed.

The gate insulating layer 150, the first gate barrier layer 160a, the second gate barrier layer 160b, and the gate metal layer 160c may be substantially simultaneously patterned in a same etching process using the first and second photoresist patterns PR1 and PR2. The etching process may be a wet etching process.

Figure 6:
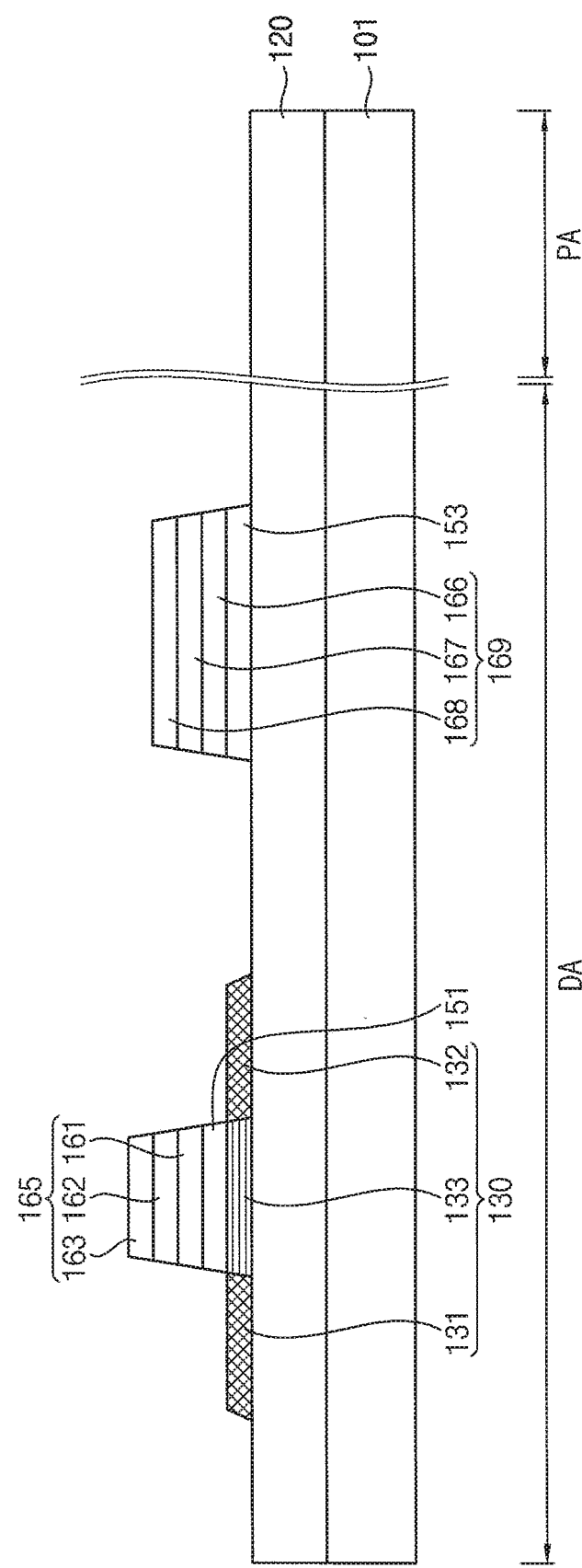

Referring to FIG. 6, a gate electrode 165 having a triple-layer structure (in which a first gate barrier layer 161, a second gate barrier layer 162, and a gate metal layer 163 are sequentially stacked) may be formed on the channel area 133 of the active pattern 130. A first gate insulating pattern 151 may be disposed between the active pattern 130 and the first gate barrier layer 161 of the gate electrode 165.

A first storage electrode 169 (having a triple-layer structure in which a first gate barrier layer 166, a second gate barrier layer 167, and a gate metal layer 168 are sequentially stacked) may be formed on the buffer layer 120 in an area designated for the storage capacitor. A second gate insulating pattern 153 may be disposed between the buffer layer 120 and the first gate barrier layer 166 of the first storage electrode 169.

Although not shown in figures, a gate line GL (having a triple-layer structure in which a first gate barrier layer, a second gate barrier layer, and a gate metal layer are sequentially stacked) may be formed on the buffer layer 120. Materials of the layers of the gate line GL may be identical to the materials of the layers of the first storage electrode 169 and may be identical to the materials of the layers of the gate electrode 165. A portion of the second gate insulating pattern 153 may be disposed between the buffer layer 120 and the first gate barrier layer of the gate line GL.

The first gate barrier layer 160a, the second gate barrier layer 160b, and the gate metal layer 160c may be substantially simultaneously patterned in a single etching process. Advantageously, the manufacturing process may be substantially simple and efficient.

The source area 131 and the drain area 132 may be formed at end portions of the active pattern 130 exposed by the gate electrode 165 by a doping process. The center portion of the active pattern 130 covered by the gate electrode 165 is not significantly doped and functions as the channel area 133. The active pattern 130 may include the source area 131, the drain area 132, and the channel area 133.

Figure 7:
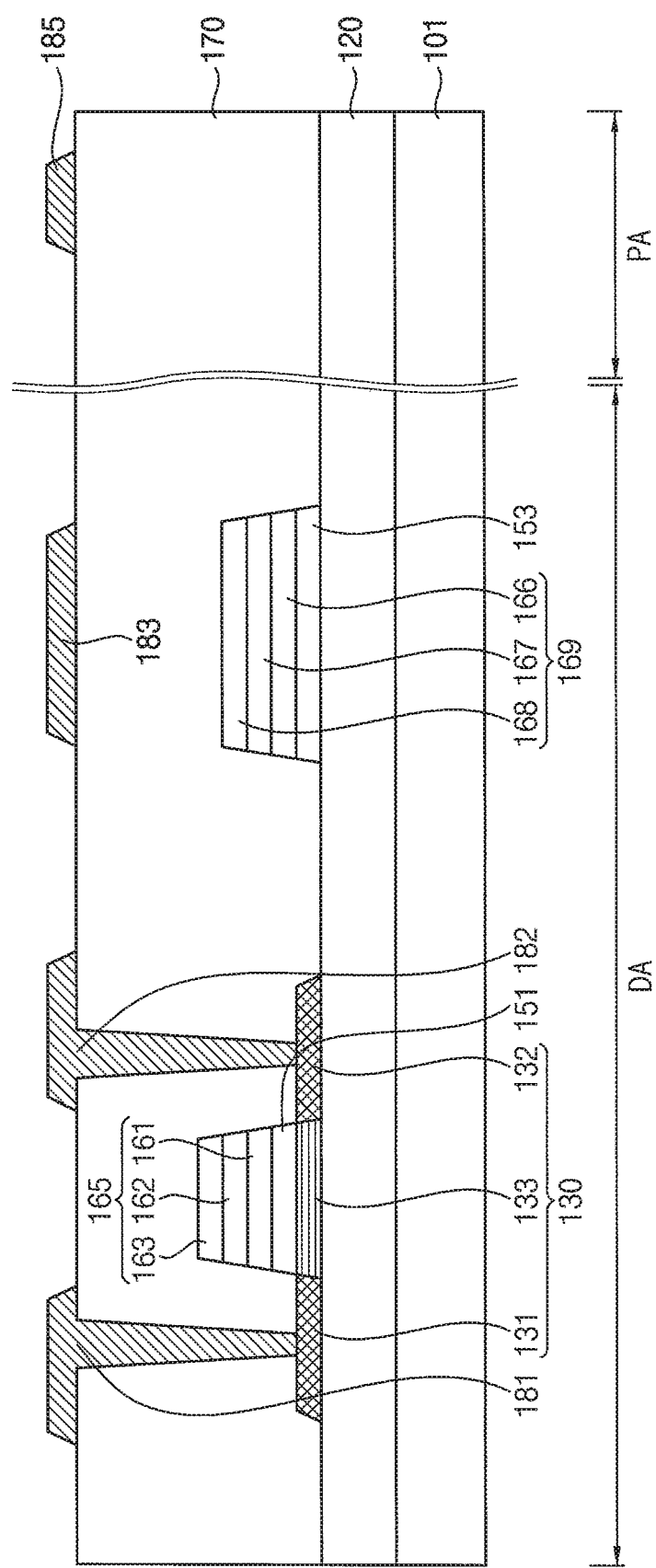

Referring to FIG. 7, an interlayer insulating layer 170 is formed on the gate electrode 165 and the first storage electrode 169.

The interlayer insulating layer 170 may be formed of silicon oxide (SiOx), silicon nitride (SiNx), or the like by a chemical vapor deposition (CVD), a sputtering, or the like.

The interlayer insulating layer 170 may be etched to form contact holes exposing the source area 131 and the drain area 132 of the active pattern 130.

A metal layer is formed on the interlayer insulating layer 170 and fills the contact holes. The source metal layer may be formed of copper (Cu), aluminum (Al), molybdenum (Mo), or the like on the interlayer insulating layer 170 by a chemical vapor deposition (CVD) process, a sputtering process, or the like.

The metal layer is patterned to form a source electrode 181 connected to the source area 131 through a contact hole and to form a drain electrode 182 connected to the drain area 131 through a contact hole. The metal layer is patterned to form a second storage electrode 183 of the storage capacitor CST overlapping the first storage electrode 169. The metal layer may be patterned to form a plurality of signal lines including data lines. The line end portion 185, which is an end portion of a signal line, may be formed in the peripheral area PA.

Figure 8:
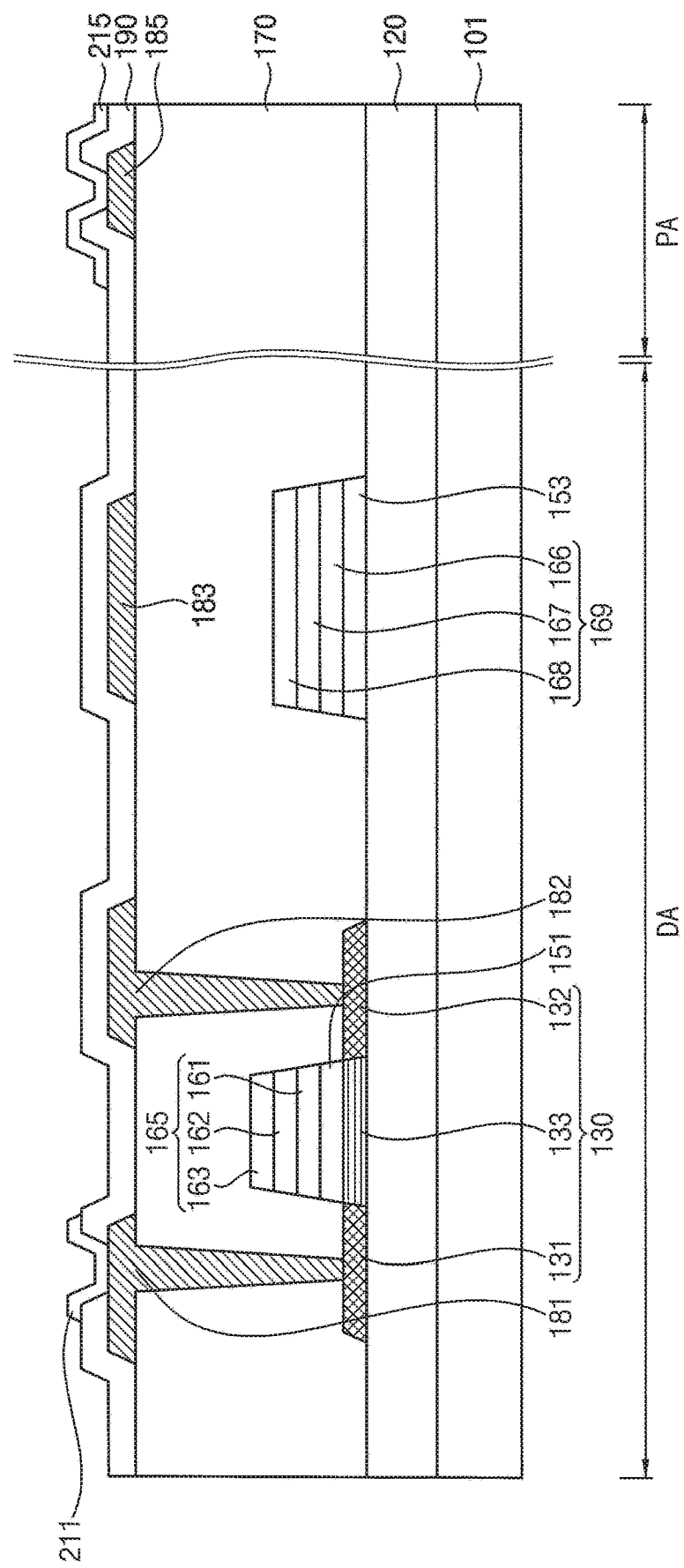

Referring to FIG. 8, the passivation layer 190 is formed on the source electrode 181, the drain electrode 182, the second electrode 183, and the line end portion 185. The passivation layer 190 may be formed of silicon oxide (SiOx), silicon nitride (SiNx), or the like by a chemical vapor deposition (CVD) process, a sputtering process, or the like.

The passivation layer 190 may be etched to form contact holes exposing underlying conductors, for example, the drain electrode 182 and the line end portion 185.

A transparent conductive layer is formed on the passivation layer 190 and enters the contact holes. The transparent conductive layer may include indium tin oxide (ITO), indium zinc oxide (IZO), zinc oxide (ZnO), and the like.

The transparent conductive layer may be etched to form a connection electrode 211 connected to the drain electrode 182 through a contact hole and to form a pad electrode 215 connected to the line end portion 185 through a contact hole.

Figure 9:
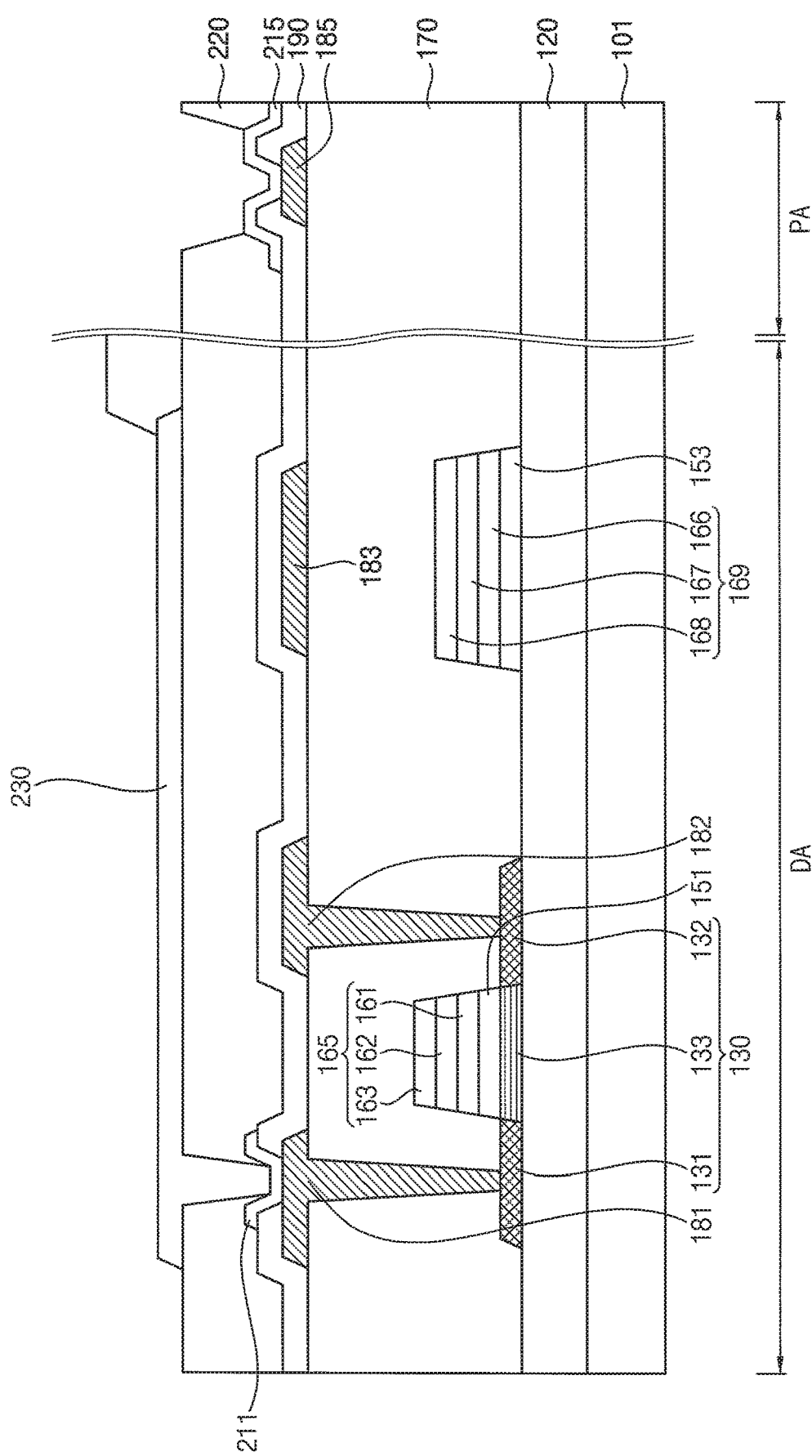

Referring to FIG. 9, the substantially thick planarization layer 220 may be formed on the connection electrode 211 and the pad electrode 215 in order to planarize a top surface of the substrate 101.

The planarization layer 220 may include an organic material such as an acrylic resin, an epoxy resin, a polyimide resin, and a polyester resin.

The planarization layer 220 may be etched to form a via-hole exposing the connection electrode 211 and may be partially removed to expose the pad electrode 215 in the peripheral area PA.

A pixel electrode layer may be formed on the planarization layer 220. The pixel electrode layer may include, for example, indium tin oxide (ITO), indium zinc oxide, indium zinc oxide, IZO, zinc oxide, or indium oxide.

The pixel electrode layer may be patterned to form the pixel electrode 230. The pixel electrode 230 is formed in the pixel area on the planarization layer 220 and may be electrically connected to the connection electrode 211 through the via-hole. The pixel electrode 230 may be electrically connected to the transistor through the connection electrode 211.

Figure 10:
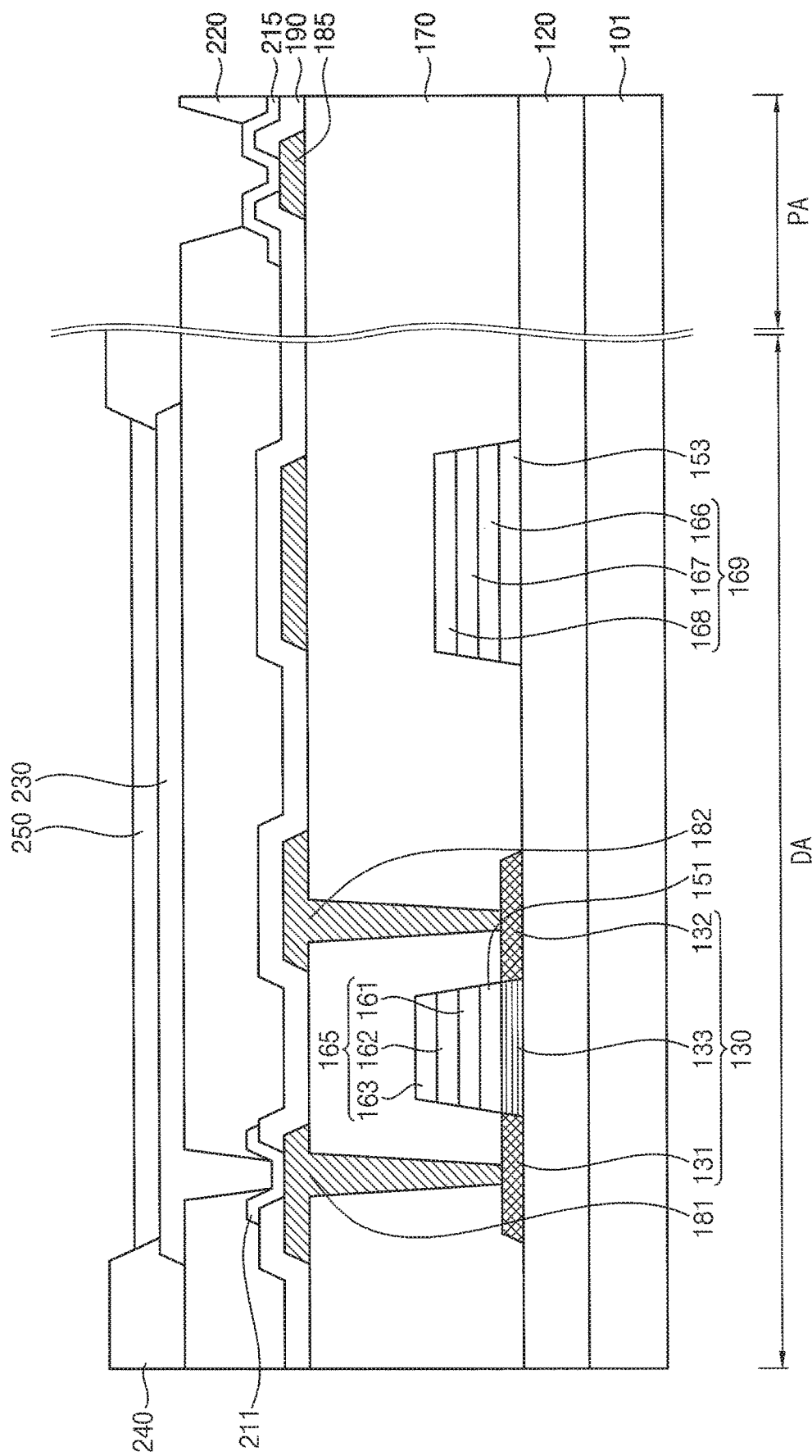

Referring to FIG. 10, the pixel defining layer 240 may be formed on the planarization layer 220 and on the pixel electrode 230. The pixel defining layer 220 may include a transparent organic material such as polyimide resin or acrylic resin.

The pixel defining layer 240 may be patterned to form an opening exposing the pixel electrode 230.

The organic light emitting layer 250 may be disposed in the opening of the pixel defining layer 240 and on the pixel electrode 230. The organic light emitting layer 250 may include a host material that is excited by holes and electrons, and a dopant material that increases light emission efficiency through absorption and emission of energy.

Referring to FIG. 2, the common electrode 260 may be disposed opposite the pixel electrode 230. The common electrode 260 may span a plurality of pixel areas on the substrate 101. The common electrode 260 may include a metal having a low work function such as Al, Ag, W, Cu, Ni, Cr, Mo, Ti, Pt, Ta, Nd or Sc or an alloy of some of the metals.

According to embodiments, the gate electrode may have a triple-layer structure in which a first gate barrier layer, a second gate barrier layer, and a gate metal layer are sequentially stacked.

An active pattern including an oxide semiconductor may be formed in a low-oxygen partial pressure condition to optimize the reliability of the transistor.

The first gate barrier layer may be formed in a high-oxygen partial pressure condition to compensate for oxygen defects in the active pattern formed in the low-oxygen partial pressure condition.

The second gate barrier layer may prevent oxidation of the gate metal layer, thereby preventing the oxidation of the gate electrode and the associated gate line.

The first gate barrier layer, the second gate barrier layer and the gate metal layer are substantially simultaneously etched to simplify the manufacturing process.

Figure 11:
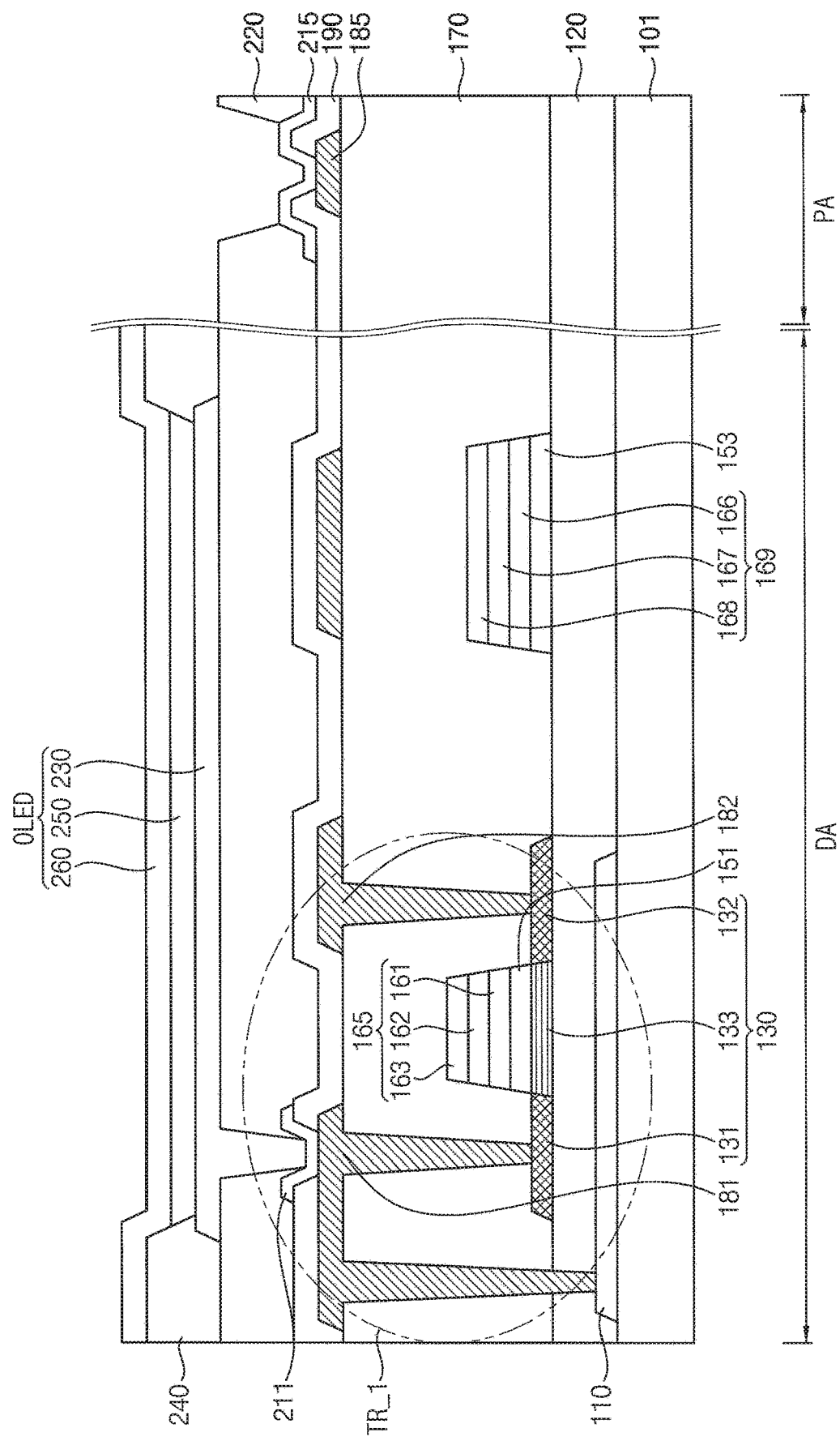
FIG. 11 is a cross-sectional view illustrating a display device according to one embodiment.

FIG. 11 is a cross-sectional view illustrating a display device according to one embodiment. Descriptions of above-described elements may not be repeated.

Referring to FIG. 11, the display device includes a transistor TR_1.

The transistor TR 1 may include a bottom gate electrode 110, an active pattern 130, a gate electrode 165, a source electrode 181, and a drain electrode 182.

The bottom gate electrode 110 may be disposed between the active pattern 130 and the substrate 101, and the gate electrode 165 may be disposed between the active pattern 130 and the pixel electrode 230.

The bottom gate electrode 110 may be disposed between the substrate 101 and the buffer layer 120. The bottom gate electrode 110 is disposed on the substrate 101, the buffer layer 120 is disposed on the bottom gate electrode 110, the active pattern 130 is disposed on the buffer layer 120, the first gate insulating pattern 151 is disposed on the active pattern 130, and the gate electrode 165 may be disposed on the first gate insulating pattern 151.

The bottom gate electrode 110, the channel area 133 of the active pattern 130, and the gate electrode 165 may overlap with each other.

The bottom gate electrode 110 may include at least one of copper (Cu), a copper alloy, aluminum (Al), an aluminum alloy, molybdenum (Mo), and a molybdenum alloy.

The bottom gate electrode 110 may be electrically connected to another electrode of the transistor, for example, the drain electrode 182, through a contact hole. Alternatively, the bottom gate electrode 110 may be electrically connected to the gate electrode 165.

A current path may be formed in a portion of the active pattern adjacent to the gate electrode. In the transistor TR_1 including the bottom gate electrode 110, an upper portion of the channel area 133 adjacent to the gate electrode 165 and a lower portion of the channel area 133 adjacent to the bottom gate electrode 110 are used as current paths. Thus, an additional current path may be provided, and a charge mobility of the active pattern 130 may increase.

Figure 12:
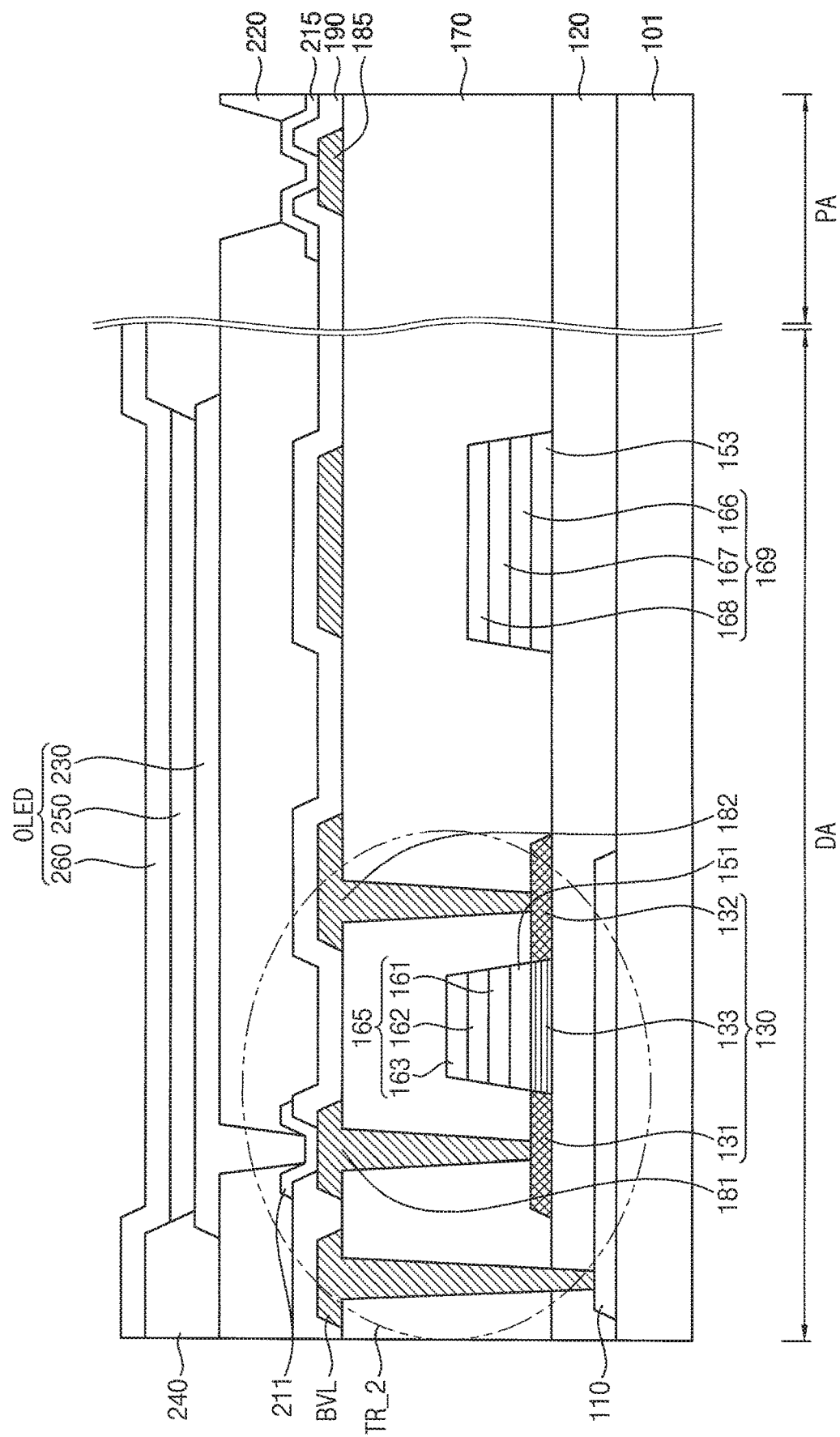
FIG. 12 is a cross-sectional view illustrating a display device according to one embodiment.

FIG. 12 is a cross-sectional view illustrating a display device according to one embodiment. Descriptions of above-described elements may not be repeated.

Referring to FIG. 12, the display device includes transistor TR_2.

The transistor TR_2 may include a bottom gate electrode 110, an active pattern 130, a gate electrode 165, a source electrode 181, and a drain electrode 182.

The bottom gate electrode 110, the channel area 133 of the active pattern 130, and the gate electrode 165 may overlap with each other.

The bottom gate electrode 110 may be electrically connected to a bias voltage line BVL.

The bias voltage line BVL may transfer a bias voltage to improve the characteristics of the transistor TR_2.

The bias voltage line BVL may be a signal line formed from a metal layer. The bias voltage line BVL may be electrically connected to the bottom gate electrode 110 through a contact hole.

According to embodiments, a gate electrode may have a triple-layer structure in which a first gate barrier layer, a second gate barrier layer, and a gate metal layer are sequentially stacked.

An active pattern including an oxide semiconductor may be formed in a low-oxygen partial pressure condition to improve the reliability of the transistor. The first gate barrier layer may be formed in a high-oxygen partial pressure condition to compensate for oxygen defects in the active pattern formed in the low-oxygen partial pressure condition. The second gate barrier layer may prevent oxidation of the gate metal layer, thereby preventing oxidation of the gate electrode and the associated gate line. The first gate barrier layer, the second gate barrier layer and the gate metal layer are substantially simultaneously etched to simplify the manufacturing process.

Embodiments may be applied to a display device and an electronic device having the display device. For example, embodiments may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative and is not to be construed as limiting. Although a few embodiments have been described, many modifications are possible in the embodiments. All such modifications are intended to be included within the scope defined in the claims. In the claims, means-plus-function clauses are intended to cover the structures described herein as performing the recited function and not only structural equivalents but also equivalent structures.

What is claimed is:

1. A display device comprising:
a semiconductor member comprising a source area, a drain area, and a channel area between the source area and the drain area;
a first gate electrode comprising a first gate barrier layer, a second gate barrier layer, and a gate metal layer, wherein the first gate barrier layer overlaps the channel area, wherein an oxide material of the first gate barrier layer is identical to an oxide material of the semiconductor member, and wherein the second gate barrier layer comprises a metal oxide alloy and is positioned between the first gate barrier layer and the gate metal layer;
a pixel electrode electrically connected to the drain area; and
a common electrode overlapping the pixel electrode.

2. The display device of claim 1, further comprising:
a gate insulating member overlapping the channel area and disposed between the semiconductor member and the first gate barrier layer.

3. The display device of claim 1, wherein each of the semiconductor member and the first gate barrier layer comprises indium-gallium-zinc oxide (IGZO).

4. The display device of claim 1, wherein the second gate barrier layer comprises an alloy of zinc oxide (ZnOx) and indium oxide (InOx).

5. The display device of claim 4, wherein a composition ratio of the zinc oxide (ZnOx) and the indium oxide (InOx) of the second gate barrier layer is 9:1.

6. The display device of claim 4, wherein the first gate barrier layer has a thickness of about 200 angstroms or less.

7. The display device of claim 4, wherein the second gate barrier layer has a thickness of about 200 angstroms or less.

8. The display device of claim 1, further comprising:
a substrate; and
a second gate electrode disposed between the substrate and the semiconductor member and overlapping the channel area.

9. The display device of claim 1, further comprising:
an organic light emitting layer disposed between the pixel electrode and the common electrode.

10. The display device of claim 1, further comprising:
a storage capacitor comprising a first storage electrode and a second storage electrode; and
a gate line electrically connected to the first gate electrode,
wherein each of a triple-layer structure of the first storage electrode and a triple-layer structure of the gate line is identical to a triple-layer structure of the first gate electrode.

* * * * *